United States Patent
Kadota (10) Patent No.: US 9,564,873 B2
(45) Date of Patent: Feb. 7, 2017

(54) ELASTIC WAVE DEVICE

(71) Applicant: Murata Manufacturing Co., Ltd., Nagaokakyo-shi, Kyoto-fu (JP)

(72) Inventor: Michio Kadota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 346 days.

(21) Appl. No.: 14/170,883

(22) Filed: Feb. 3, 2014

(65) Prior Publication Data

US 2014/0145556 A1 May 29, 2014

Related U.S. Application Data

(63) Continuation of application No. PCT/JP2012/069865, filed on Aug. 3, 2012.

(30) Foreign Application Priority Data

Aug. 8, 2011 (JP) .................. 2011-173120

(51) Int. Cl.
*H03H 9/02* (2006.01)
*H03H 9/25* (2006.01)

(52) U.S. Cl.
CPC ..... *H03H 9/02559* (2013.01); *H03H 9/02228* (2013.01); *H03H 9/02992* (2013.01); *H03H 9/25* (2013.01)

(58) Field of Classification Search
CPC .. H03H 9/02559; H03H 9/25; H03H 9/02228; H03H 9/02535; H03H 9/02614; H03H 9/02622; H03H 9/05; H03H 9/058

(Continued)

(56) References Cited

U.S. PATENT DOCUMENTS

| 5,532,538 A | 7/1996 | Jin et al. |
| 2007/0096592 A1* | 5/2007 | Kadota ............. H03H 3/08 310/313 A |

(Continued)

FOREIGN PATENT DOCUMENTS

| EP | 1 821 406 A2 | 8/2007 |
| JP | 2002-152007 A | 5/2002 |

(Continued)

OTHER PUBLICATIONS

Official Communication issued in corresponding European Patent Application No. 12822720.4, mailed on Feb. 19, 2015.

(Continued)

*Primary Examiner* — Derek Rosenau
(74) *Attorney, Agent, or Firm* — Keating & Bennett, LLP (57) ABSTRACT

An elastic wave device making use of an SH plate wave propagating in $LiNbO_3$ substrates includes a $LiNbO_3$ substrate, IDT electrodes located on at least one surface of the $LiNbO_3$ substrate, and a support which is bonded to the $LiNbO_3$ substrate such that the support is located outside a region provided with the IDT electrodes and supports the $LiNbO_3$ substrate, wherein θ of the Euler angles (0°, θ, 0°) of the $LiNbO_3$ substrate ranges from about 92° to about 138° and the thickness of the $LiNbO_3$ substrate ranges from about 0.05λ to about 0.25λ, where λ is the wavelength determined by the pitch between electrode fingers of the IDT electrodes.

20 Claims, 9 Drawing Sheets (58) Field of Classification Search
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 2007/0188047 | A1* | 8/2007 | Tanaka | H03H 9/02228 310/313 D |
| 2008/0179989 | A1 | 7/2008 | Ogami et al. | |
| 2010/0052472 | A1 | 3/2010 | Nishino et al. | |
| 2010/0123367 | A1* | 5/2010 | Tai | H03H 9/02574 310/313 B |
| 2011/0109196 | A1 | 5/2011 | Goto et al. | |
| 2011/0266918 | A1 | 11/2011 | Iwamoto et al. | |
| 2011/0273061 | A1* | 11/2011 | Thalmayr | H03H 9/02275 310/346 |

FOREIGN PATENT DOCUMENTS

| | | |
|---|---|---|
| JP | 2002-368576 A | 12/2002 |
| JP | 2010-56736 A | 3/2010 |
| WO | 2007/046236 A1 | 4/2007 |
| WO | 2010/004741 A1 | 1/2010 |
| WO | 2010/082571 A1 | 7/2010 |

OTHER PUBLICATIONS

Vohra, G. et al., "High Frequency Shear Horizontal Plate Acoustic Wave Devices", Ultrasonics, , vol. 49, No. 8, Dec. 1, 2009, pp. 760-764.

Zaitsev, B. et al., "Investigation of Quasi-Shear-Horizontal Acoustic Waves in Thin Plates of Lithium Niobate", Smart Materials and Structures, vol. 6, No. 6, Dec. 1, 1997, pp. 739-744.

Joshi, S. et al., "Characteristics of Fundamental Acoustic Wave Modes in Thin Piezoelectric Plates", Ultrasonics, vol. 44, Dec. 22, 2006, pp. e787-e791.

Official Communication issued in International Patent Application No. PCT/JP2012/069865, mailed on Sep. 18, 2012.

\* cited by examiner

FIG. 16 Prior Art

ELASTIC WAVE DEVICE

BACKGROUND OF THE INVENTION

1. Field of the Invention

The present invention relates to elastic wave devices used as resonators or band-pass filters and particularly relates to an elastic wave device making use of an SH plate wave propagating in LiNbO₃ substrates.

2. Description of the Related Art

Figure 16:
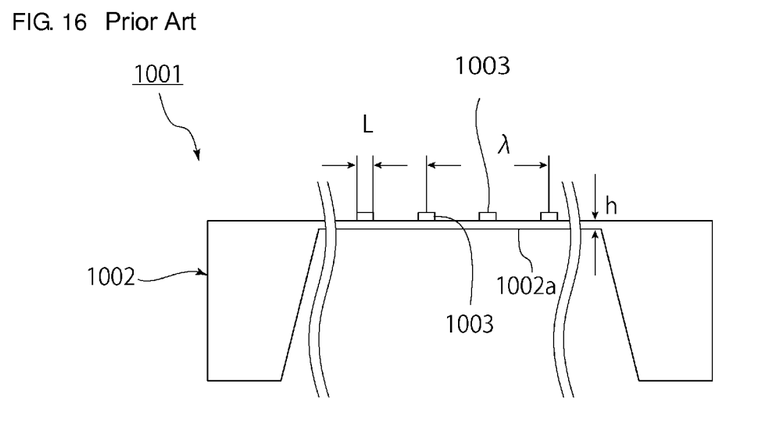
FIG. 16 is a schematic sectional view of an example of a conventional elastic wave resonator.

Hitherto, various elastic wave devices making use of a plate wave propagating in LiNbO₃ have been proposed. For example, Japanese Unexamined Patent Application Publication No. 2002-152007 below discloses an elastic wave resonator shown in FIG. 16. The elastic wave resonator 1001 includes a LiNbO₃ single-crystalline substrate 1002 as shown in FIG. 16. The center of the LiNbO₃ single-crystalline substrate 1002 is a thin plate portion 1002*a*. That is, a central portion of the LiNbO₃ single-crystalline substrate 1002 is thin and has a thickness h. In an example described in Japanese Unexamined Patent Application Publication No. 2002-152007, the thickness h is $0.03\lambda_0$.

The upper surface of the thin plate portion 1002*a* is overlaid with IDT electrodes 1003. Supposing the pitch between electrode fingers of the IDT electrodes 1003 is $\lambda_0$, the width L of the electrode fingers is $0.125\lambda_0$.

Japanese Unexamined Patent Application Publication No. 2002-152007 describes that when the orientation of LiNbO₃ is rotated about the X-axis at an angle of −10° to 70° in a direction from the Y-axis to the Z-axis, a major component of elastic vibration is an SH wave and a piezoelectric effect is large.

In the example described in Japanese Unexamined Patent Application Publication No. 2002-152007, the IDT electrodes 1003 are made of an Al-0.7% Cu alloy. On the other hand, the LiNbO₃ single-crystalline substrate 1002 is a 40° Y substrate. This means that θ of Euler angles (φ, θ, ψ) is equal to 130°.

On the other hand, paragraph [0051] of Japanese Unexamined Patent Application Publication No. 2002-368576 below discloses an elastic wave element containing LiNbO₃ with a rotation angle of 36°±20°, that is, LiNbO₃ with Euler angles (0°, 106° to 146°, 0°). Herein, an elastic wave-propagating surface of a piezoelectric substrate made of LiNbO₃ is mechanically free and the thickness of the piezoelectric substrate made of LiNbO₃ is less than the wavelength λ of an elastic wave.

However, Japanese Unexamined Patent Application Publication No. 2002-152007 merely describes that when the orientation of LiNbO₃ is within the above specific range, that is, a range specified in terms of Euler angles (0°, 80° to 160°, 0°), the piezoelectric effect due to the SH plate wave is large. A configuration using the SH plate wave described in Japanese Unexamined Patent Application Publication No. 2002-152007 cannot necessarily achieve a sufficiently large electromechanical coupling coefficient k² and therefore is limited in increasing the fractional bandwidth, or bandwidth ratio. Incidentally, Japanese Unexamined Patent Application Publication No. 2002-152007 does not particularly refer to the thickness of the IDT electrodes.

Japanese Unexamined Patent Application Publication No. 2002-368576 discloses the elastic wave device containing LiNbO₃ with the above Euler angles and a structure having an elastic wave-propagating region which is mechanically free and, however, does not describe any configuration using an SH plate wave.

SUMMARY OF THE INVENTION

Preferred embodiments of the present invention provide an elastic wave device which makes use of an SH plate wave propagating in LiNbO₃ substrates, effectively increases the electromechanical coupling coefficient $k^2$, and increases the bandwidth ratio.

An elastic wave device according to a preferred embodiment of the present invention makes use of an SH plate wave propagating in LiNbO₃ substrates. The elastic wave device according to a preferred embodiment of the present invention includes a LiNbO₃ substrate, IDT electrodes located on at least one surface of the LiNbO₃ substrate, and a support which is arranged on the LiNbO₃ substrate such that the support is located outside a region provided with the IDT electrodes and supports the LiNbO₃ substrate. In the present preferred embodiment of the present invention, θ of the Euler angles (0°, θ, 0°) of the LiNbO₃ substrate ranges from about 92° to about 138° and the thickness of the LiNbO₃ substrate ranges from about 0.05λ to about 0.25λ, where λ is the wavelength determined by the pitch between electrode fingers of the IDT electrodes.

In a specific aspect of the elastic wave device according to a preferred embodiment of the present invention, the IDT electrodes are made of a metal containing one of the metals shown in Table 1 below as a major component and have a thickness within a range specified in Table 1 depending on the type of the metal.

TABLE 1

|    | Thickness of IDT electrode       |
|----|----------------------------------|
| Pt | More than 0 to 0.083λ or less    |
| Au | More than 0 to 0.055λ or less    |
| Cu | More than 0 to 0.11λ or less     |
| Ni | More than 0 to 0.16λ or less     |
| Al | More than 0 to 0.135λ or less    |

In this case, the fractional bandwidth of an SH plate wave is adjusted to about 25% or more, for example.

In another specific aspect of the elastic wave device according to a preferred embodiment of the present invention, the IDT electrodes are made of a metal containing one of the metals shown in Table 2 below as a major component and the duty is within a range specified in Table 2 depending on the type of the metal. The duty is represented by W/(W+G), where W is the width of the electrode fingers of the IDT electrodes and G is the gap between the electrode fingers.

TABLE 2

|    | Duty            |
|----|-----------------|
| Pt | 0.105 to 0.62   |
| Au | 0.105 to 0.585  |
| Cu | 0.11 to 0.645   |
| Ni | 0.11 to 0.655   |
| Al | 0.115 to 0.63   |

In this case, the fractional bandwidth is increased to about 26% or more.

In another specific aspect of the elastic wave device according to a preferred embodiment of the present invention, the IDT electrodes are located on both surfaces of the LiNbO₃ substrate, the IDT electrodes are made of a metal containing one of metals shown in Table 3 below as a major component, and the thickness of the IDT electrodes is within a range specified in Table 3 depending on the type of the metal.

TABLE 3

| Metal making up electrode | Thickness of single-side IDT electrodes |
|---|---|
| Pt | More than 0 to 0.14λ or less |
| Au | More than 0 to 0.067λ or less |
| Cu | More than 0 to 0.145λ or less |
| Ni | 0.002λ to 0.20λ |
| Al | More than 0 to 0.125λ or less |

In this case, the fractional bandwidth is increased to about 27% or more, for example.

In another specific aspect of the elastic wave device according to a preferred embodiment of the present invention, the IDT electrodes are located on both surfaces of the LiNbO$_3$ substrate and the duty of the IDT electrodes is within a range specified in Table 4 below depending on the type of a metal making up the IDT electrodes.

TABLE 4

| Metal making up electrode | Duty |
|---|---|
| Pt | 0.018 to 0.547 |
| Au | 0.018 to 0.523 |
| Ni | 0.018 to 0.597 |
| Cu | 0.018 to 0.567 |
| Al | 0.025 to 0.56 |

In this case, the fractional bandwidth is increased to about 28% or more, for example.

In another specific aspect of the elastic wave device according to a preferred embodiment of the present invention, the support is a support substrate including a through-hole facing a region provided with the IDT electrodes. As described above, a portion facing the region provided with the IDT electrodes may be the through-hole of the support substrate.

In another specific aspect of the elastic wave device according to a preferred embodiment of the present invention, the IDT electrodes are made of a metal containing a metal having a density between about 2.699×10$^3$ kg/m$^3$ to about 8.93×10$^3$ kg/m$^3$, for example, as a major component.

In an elastic wave device according to various preferred embodiments of the present invention, θ of the Euler angles of LiNbO$_3$ is within the above specific range and the thickness of a LiNbO$_3$ substrate is within the above specific range; hence, the electromechanical coupling coefficient of an SH plate wave is effectively increased. Therefore, resonators and filters with a large bandwidth ratio are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the accompanying drawings such that the present invention will become apparent.

Figure 1A:
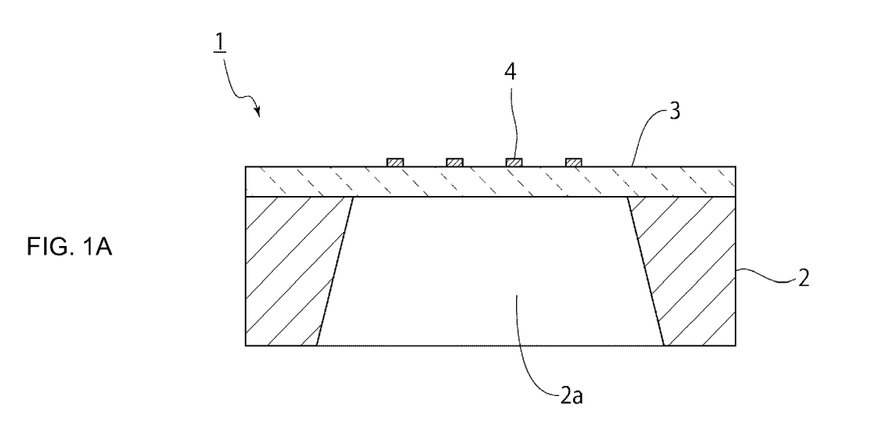
FIG. 1A is a front sectional view of an elastic wave device according to a first preferred embodiment of the present invention and FIG. 1B is a schematic plan view illustrating the electrode structure thereof.
Figure 1B:
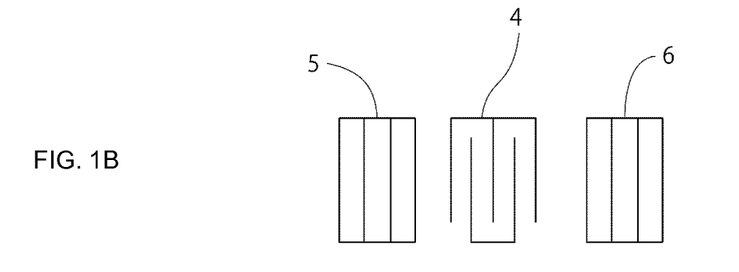

FIG. 1A is a front sectional view of an elastic wave device according to a first preferred embodiment of the present invention and FIG. 1B is a schematic plan view illustrating the electrode structure of the elastic wave device.

The elastic wave device 1 of this preferred embodiment includes a support 2. The support 2 is made of an appropriate rigid material such as Si, an insulating ceramic, or metal. The support 2 is overlaid with a LiNbO$_3$ substrate 3. The thickness of the LiNbO$_3$ substrate 3 preferably ranges from about 0.05, to about 0.25λ, for example. The support 2 includes a through-hole 2a. In a region facing the through-hole 2a, IDT electrodes 4 are located on the upper surface of the LiNbO$_3$ substrate 3.

FIG. 1A schematically shows a portion provided with the IDT electrodes 4. In particular, an electrode structure including the IDT electrodes 4 and reflectors 5 and 6 located on both sides of one of the IDT electrodes 4 is located as shown in FIG. 1B. The through-hole 2a is located under the electrode structure. In this preferred embodiment, the presence of the electrode structure provides a one port-type elastic wave resonator.

In this preferred embodiment, the thickness of the LiNbO$_3$ substrate 3 preferably ranges from about 0.05λ to about 0.25λ as described above and θ of the Euler angles (0°, θ, 0°) thereof preferably ranges from about 92° to about 138°. Incidentally, λ is the wavelength determined by the pitch between electrode fingers of the IDT electrodes 4.

In this preferred embodiment, the above-described configuration allows the electromechanical coupling coefficient $k^2$ of an SH plate wave to be significantly increased. Thus, resonators and filters with a large bandwidth ratio are provided. This is described in detail with reference to FIGS. 2 to 9.

Figure 2:
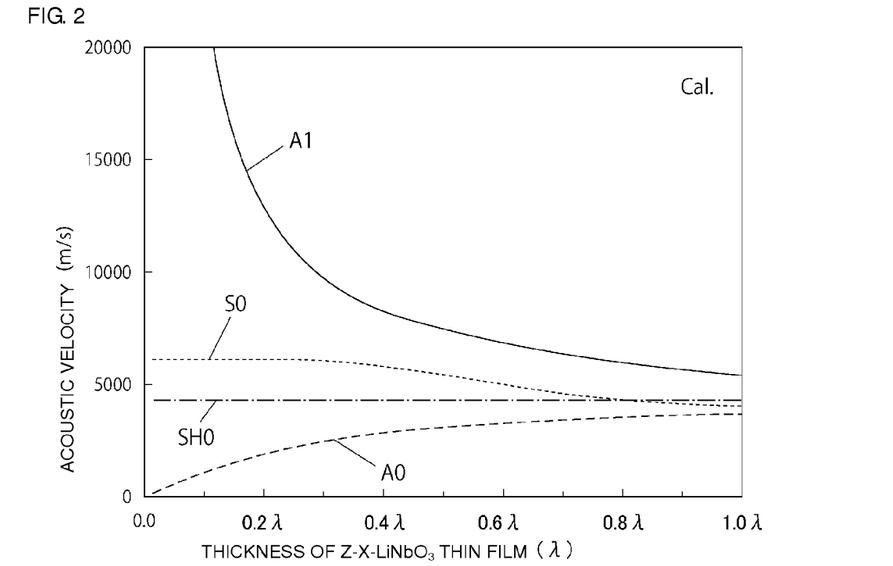
FIG. 2 is a graph showing the relationship between the thickness of Z-cut LiNbO$_3$ substrates and the acoustic velocity of X-propagating elastic waves.

FIG. 2 is a graph showing Z-X propagation, that is, the relationship between the thickness of LiNbO$_3$ substrates with Euler angles (0°, 0°, 0°) and the acoustic velocity of elastic waves propagating in the LiNbO$_3$. Incidentally, SH0 represents the fundamental mode of a SH plate wave and A0, A1, and S0 represent modes of lamb waves. As is clear from FIG. 2, the acoustic velocity of the SH plate wave SH0 varies very little when the thickness of LiNbO$_3$ widely ranges from 0 to about 1.0λ.

Figure 3:
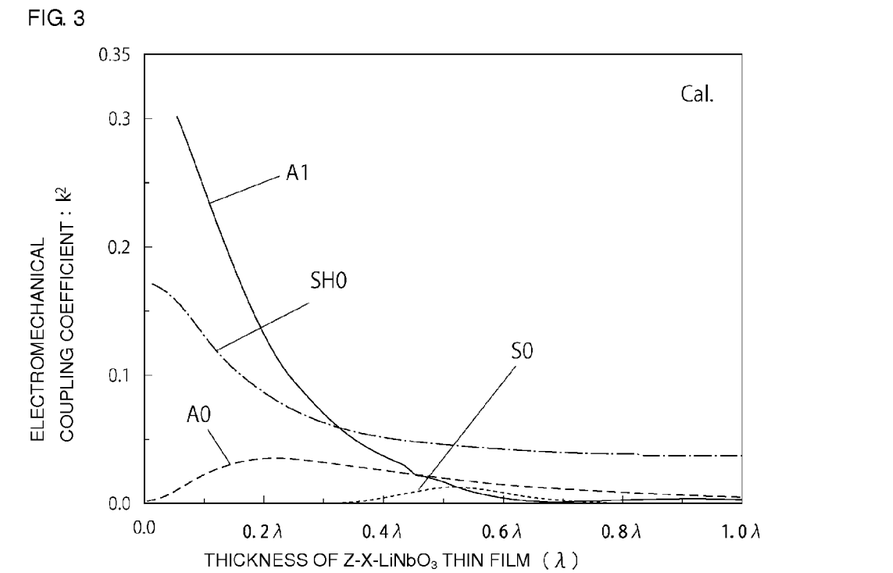
FIG. 3 is a graph showing the relationship between the thickness of Z-cut LiNbO$_3$ substrates and the electromechanical coupling coefficient of X-propagating elastic waves.

FIG. 3 shows the relationship between the thickness of LiNbO$_3$ substrates with Euler angles (0°, 0°, 0°) and the electromechanical coupling coefficient $k^2$ of elastic waves. As is clear from FIG. 3, when the thickness of the LiNbO$_3$ substrates is small, the electromechanical coupling coefficient $k^2$ of an SH plate wave SH0 is large. In particular, when the thickness of the LiNbO$_3$ is about 0.2λ or less, the electromechanical coupling coefficient $k^2$ can be increased to about 0.08 or more, for example. In the case of about 0.2λ or less, the electromechanical coupling coefficient $k^2$ sharply increases with a reduction in thickness.

As described above, it is clear that when the thickness of the LiNbO$_3$ is small, the change in acoustic velocity of the SH plate wave is small and the electromechanical coupling coefficient $k^2$ can be increased.

Figure 4:
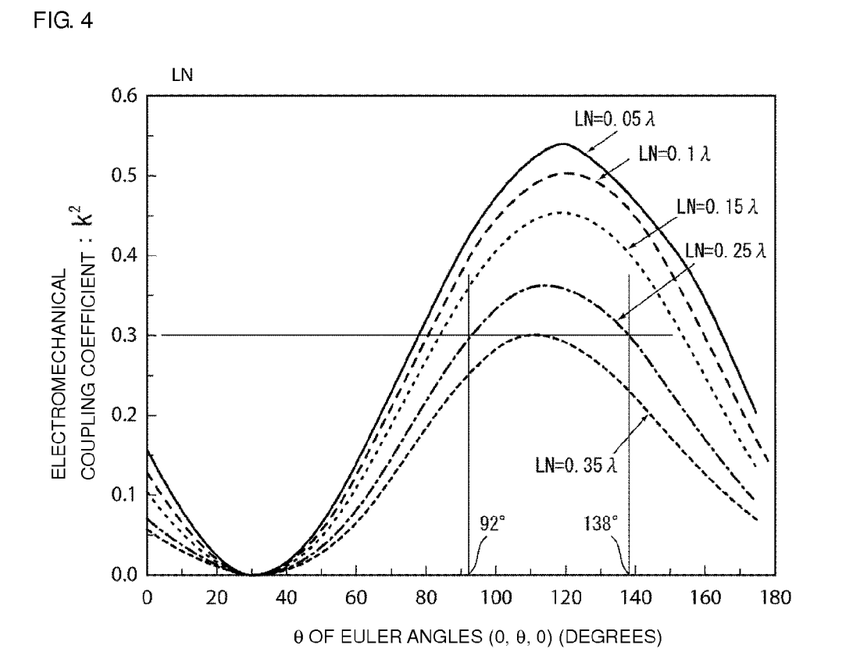
FIG. 4 is a graph showing the relationship between θ of the Euler angles of LiNbO$_3$ substrates with various thicknesses and the electromechanical coupling coefficient k$^2$ of the fundamental mode of SH plate waves.

FIG. 4 shows the change in electromechanical coupling coefficient $k^2$ of an SH plate wave SH0 in the case where the thickness of LiNbO$_3$ is approximately 0.05λ, 0.1λ, 0.15λ, 0.25λ, or 0.35λ and θ of the Euler angles (0°, θ, 0°) of each LiNbO$_3$ substrate is varied. As is clear from FIG. 4, when the thickness of LiNbO$_3$ ranges from about 0.05λ to about 0.25λ and θ of the Euler angles ranges from about 92° to about 138°, the electromechanical coupling coefficient $k^2$ of the SH plate wave SH0 is large, about 0.30 or more. It is preferred that θ ranges from about 105° to about 132°, because the electromechanical coupling coefficient $k^2$ can be increased to about 0.33 or more. Thus, in order to increase the electromechanical coupling coefficient $k^2$ of the SH plate wave propagating in LiNbO$_3$, θ of the Euler angles of LiNbO$_3$ preferably ranges from about 92° to about 138° and more preferably ranges from about 105° to about 132°.

Figure 5:
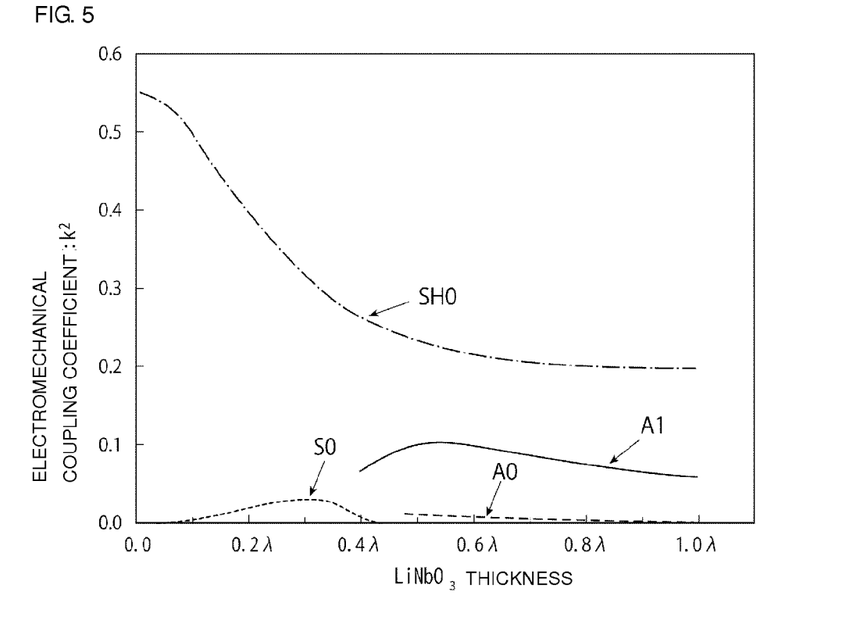
FIG. 5 is a graph showing the relationship between the thickness of LiNbO$_3$ substrates with Euler angles (0°, 120°, 0°) and the electromechanical coupling coefficient k$^2$ of elastic waves.

On the other hand, FIG. 5 is a graph showing the relationship between the thickness of LiNbO$_3$ substrates with Euler angles (0°, 120°, 0°) and the electromechanical coupling coefficient $k^2$. As is clear from FIG. 5, when the Euler angles are (0°, 120°, 0°) and the thickness of LiNbO$_3$ is about 0.25λ or less, the electromechanical coupling coefficient $k^2$ of an SH plate wave SH0 can be adjusted to about 0.33 or more. The thickness of LiNbO$_3$ is preferably about 0.2λ or less, because the electromechanical coupling coefficient $k^2$ can be adjusted to about 0.40 or more. The thickness thereof is more preferably about 0.17λ or less, because the electromechanical coupling coefficient $k^2$ can be adjusted to about 0.43 or more.

As is clear from FIGS. 2 to 5, in the case of using an SH plate wave propagating in LiNbO$_3$ substrates, when θ of the Euler angles of the LiNbO$_3$ substrates ranges from about 92° to about 138° and the thickness of the LiNbO$_3$ substrates is about 0.25λ or less, the electromechanical coupling coefficient $k^2$ of the SH plate wave can be significantly increased. Incidentally, when the thickness of the LiNbO$_3$ substrate is excessively small, the elastic wave device, which includes the IDT electrodes 4, has a significantly reduced mechanical strength. In addition, it is difficult to assemble the elastic wave device 1 because the thickness is too small. Thus, the thickness of the LiNbO$_3$ substrate preferably is about 0.05λ or more.

Next, in the elastic wave device 1, the relationship between the thickness of the IDT electrodes 4 and bandwidth ratio has been investigated. Incidentally, the bandwidth ratio and the electromechanical coupling coefficient $k^2$ are in a proportional relationship.

Figure 6:
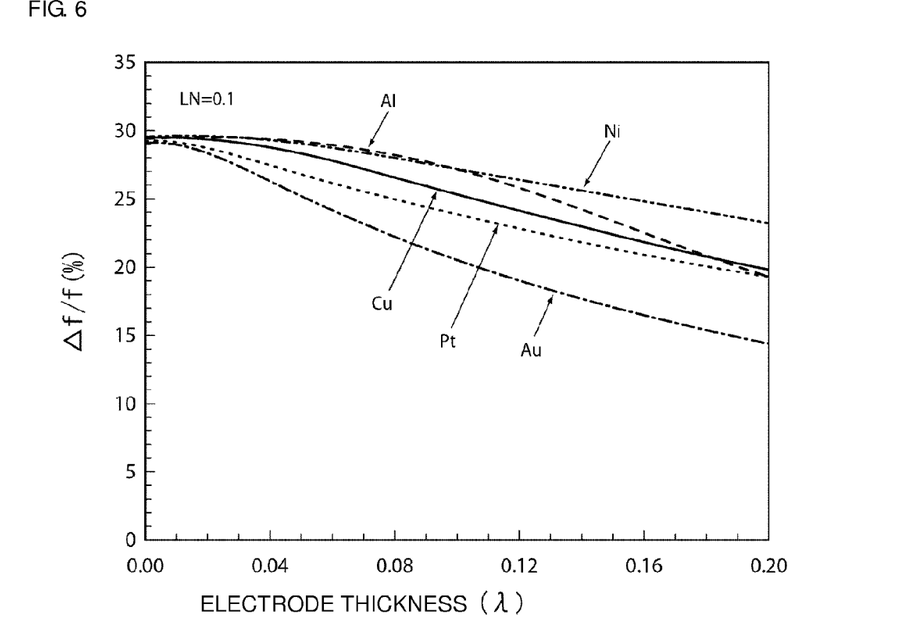
FIG. 6 is a graph showing the relationship between the thickness of IDT electrodes which are located on LiNbO$_3$ substrates having a thickness of about 0.1λ and Euler angles (0°, 120°, 0°) and which are made of various metals and the fractional bandwidth.

IDT electrodes made of various metals were formed using LiNbO$_3$ substrates having Euler angles (0°, 120°, 0°) and a thickness of about 0.1λ. In this structure, the IDT electrodes were varied in thickness and the fractional bandwidth Δf/f was determined. Incidentally, Δf is the difference between the antiresonant frequency fa and the resonant frequency f. That is, Δf equals fa minus f.

As is clear from FIG. 6, even when the IDT electrodes are made of Al, Ni, Cu, Pt, or Au, the fractional bandwidth Δf/f tends to decrease with the increase in thickness of the IDT electrodes.

Figure 7:
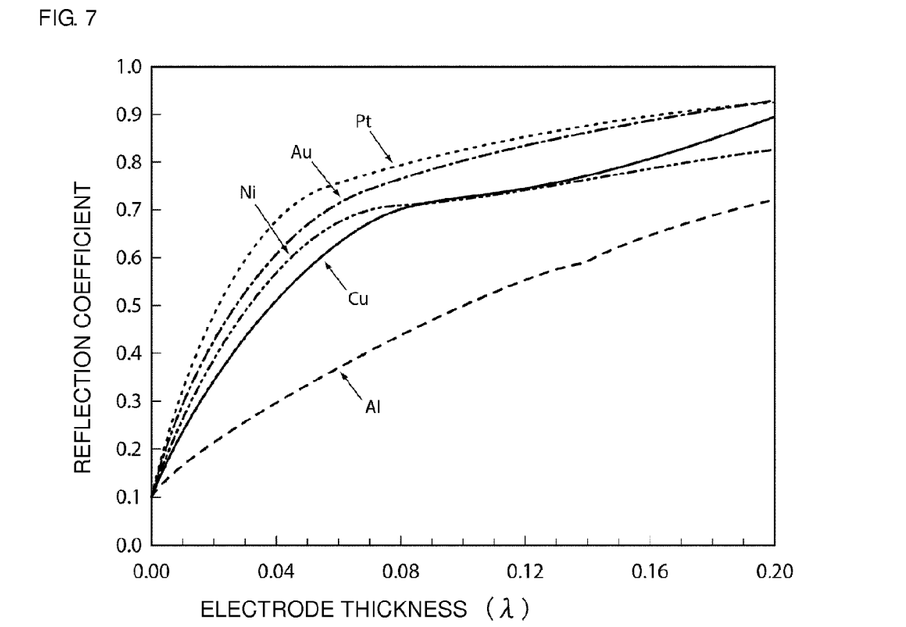
FIG. 7 is a graph showing the relationship between the thickness of IDT electrodes which are located on LiNbO$_3$ substrates having a thickness of about 0.1λ and Euler angles (0°, 120°, 0°) and which are made of various metals and reflection coefficient.

FIG. 7 is a graph showing the relationship between the thickness of IDT electrodes and reflection coefficient in the above structure. It is clear from FIG. 7 that even when being made of any metal, the reflection coefficient increases with the increase in thickness of the IDT electrodes.

From results shown in FIGS. 6 and 7, it is clear that when the thickness of the IDT electrodes is within a range shown in Table 5 below, the fractional bandwidth can be increased and the reflection coefficient can be increased to about 0.1 or more.

Herein, for metals making up IDT electrodes, metals shown in Table 1 may be major components. A metal different from the metals shown in Table 1 may be deposited.

Even when IDT electrodes are made of a metal other than the metals shown in Table 1, that is, a metal having a density between about $2.699\times10^3$ kg/m$^3$, which is the density of Al, and about $21.45\times10^3$ kg/m$^3$, which is the density of Pt, characteristics similar to characteristics shown in FIGS. 6 and 7 can be obtained. In particular, the IDT electrodes are preferably made of a metal having a density between about $2.699\times10^3$ kg/m$^3$, which is the density of Al, and about $8.93\times10^3$ kg/m$^3$, which is the density of Cu.

TABLE 5

|    | Δf/f: 25% or more Thickness of IDT electrode | Δf/f: 27% or more Thickness of IDT electrode | Δf/f: 29% or more Thickness of IDT electrode |
|----|---|---|---|
| Pt | More than 0 to 0.083λ or less | More than 0 to 0.05λ or less | More than 0 to 0.02λ or less |
| Au | More than 0 to 0.055λ or less | 0.035λ or less | 0.015λ or less |
| Cu | More than 0 to 0.11λ or less | 0.073λ or less | 0.04λ or less |
| Ni | More than 0 to 0.16λ or less | 0.105λ or less | 0.055λ or less |
| Al | More than 0 to 0.135λ or less | 0.105λ or less | 0.065λ or less |

The thickness of the IDT electrodes is preferably within a range specified in the leftmost column of Table 5, because the fractional bandwidth can be adjusted to about 25% or more. The thickness of the IDT electrodes is more preferably within a range specified in the second column from the left, because the fractional bandwidth can be adjusted to about 27% or more. The thickness of the IDT electrodes is further more preferably within a range specified in the rightmost column of Table 5, because the fractional bandwidth can be increased to about 29% or more.

Figure 8:
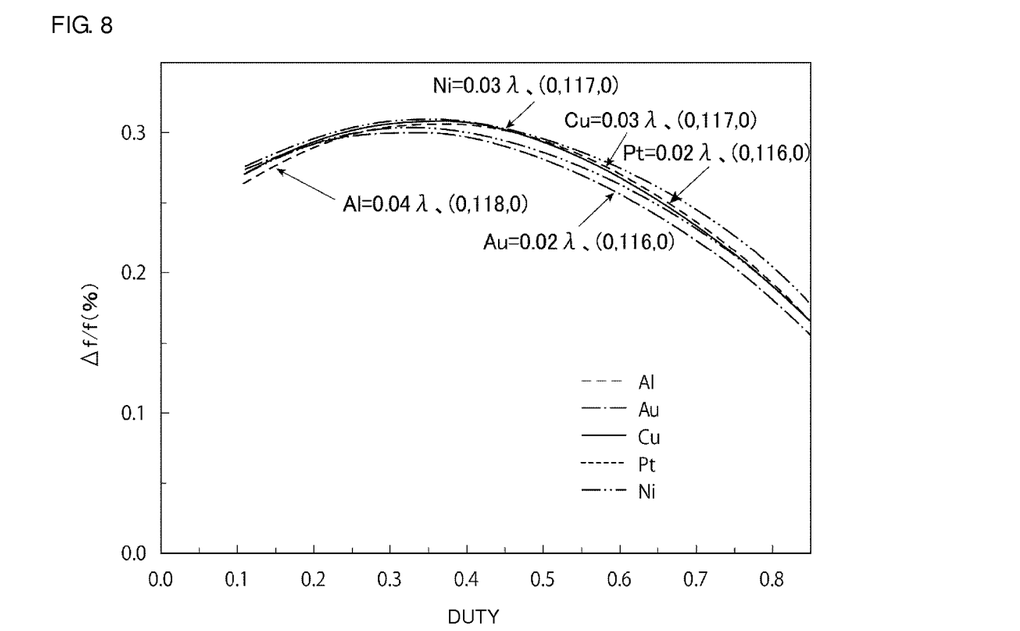
FIG. 8 is a graph showing the relationship between the duty of IDT electrodes which are located on LiNbO$_3$ substrates having a thickness of about 0.1λ and Euler angles (0°, 116° to 118°, 0°) and which are made of various metals and the fractional bandwidth.
Figure 9:
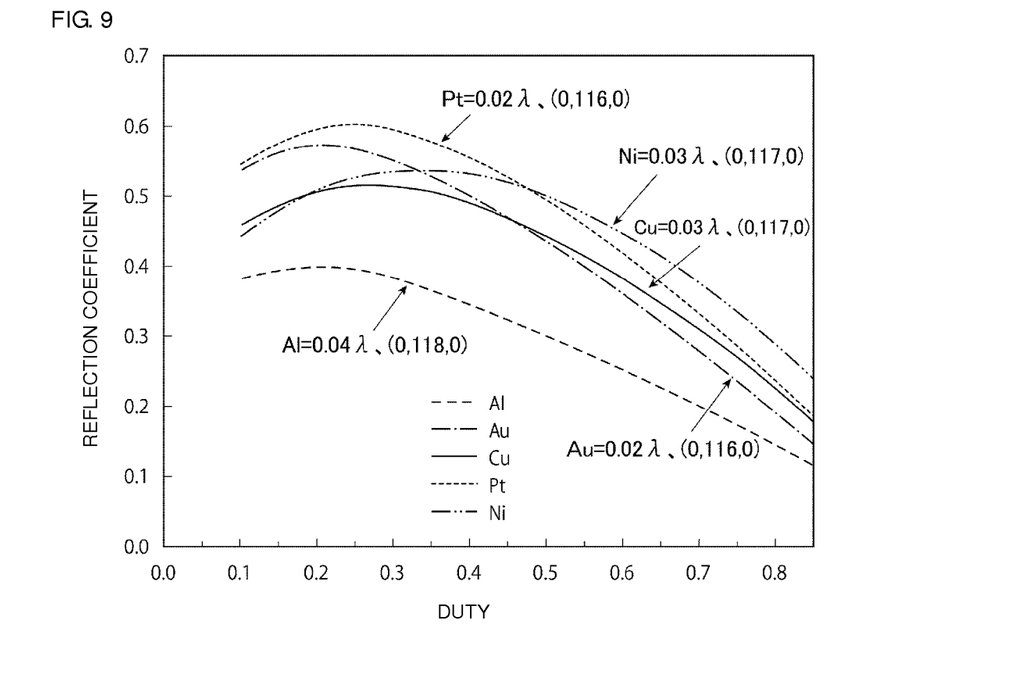
FIG. 9 is a graph showing the relationship between the duty of IDT electrodes which are located on LiNbO$_3$ substrates having a thickness of about 0.1λ and Euler angles (0°, 120°, 0°) and which are made of various metals and reflection coefficient.

Next, IDT electrodes made of various metals were provided on LiNbO$_3$ substrates having Euler angles (0°, 116° to 118°, 0°) and a thickness of about 0.1λ so as to have a thickness of about 0.02λ to about 0.04λ. Note that the duty of the IDT electrodes was varied. FIG. 8 shows the relationship between the duty of the IDT electrodes and the fractional bandwidth. FIG. 9 shows the relationship between the duty and reflection coefficient of the IDT electrodes.

As is clear from FIG. 8, in the case of using any metal, when the duty is about 0.85 or less, the fractional bandwidth increases as the duty increases from about 0.1. However, the fractional bandwidth tends to gradually decrease as the duty exceeds about 0.4. Likewise, the reflection coefficient increases as the duty increases from about 0.1. The reflection coefficient tends to significantly decrease as the duty exceeds about 0.7. When the Euler angles are (0°, 92° to 138°, 0°), the relationship between the duty and the fractional bandwidth Δf/f is on the same trend.

From results shown in FIGS. 8 and 9, it is clear that in the case where electrode made of each metal are used, the fractional bandwidth Δf/f can be increased and a sufficient reflection coefficient can be obtained in such a way that the duty of the IDT electrodes is adjusted within a range shown in Table 6 below.

Herein, for metals making up IDT electrodes, the metals shown in Table 1 may be major components. A metal different from the metals shown in Table 1 may be deposited.

Even when IDT electrodes are made of a metal other than the metals shown in Table 1, that is, a metal having a density between about $2.699\times10^3$ kg/m$^3$, which is the density of Al, and about $21.45\times10^3$ kg/m$^3$, which is the density of Pt, characteristics similar to characteristics shown in FIGS. 8 and 9 can be obtained. In particular, the IDT electrodes are preferably made of a metal having a density between about $2.699\times10^3$ kg/m$^3$, which is the density of Al, and about $8.93\times10^3$ kg/m$^3$, which is the density of Cu.

TABLE 6

|    | Δf/f: 26% or more Duty | Δf/f: 27% or more Duty | Δf/f: 30% or more Duty |
|----|---|---|---|
| Pt | 0.105 to 0.62 | 0.11 to 0.58 | 0.22 to 0.43 |
| Au | 0.105 to 0.585 | 0.11 to 0.55 | 0.25 to 0.40 |
| Cu | 0.11 to 0.645 | 0.12 to 0.62 | 0.22 to 0.46 |
| Ni | 0.11 to 0.655 | 0.12 to 0.63 | 0.22 to 0.49 |
| Al | 0.115 to 0.63 | 0.13 to 0.60 | 0.25 to 0.47 |

The duty of the IDT electrodes is preferably within a range specified in the leftmost column of Table 6, because the fractional bandwidth Δf/f can be adjusted to about 26% or more. The duty of the IDT electrodes is more preferably within a range specified in the second column from the left of Table 6, because the fractional bandwidth can be adjusted to about 27% or more. The duty of the IDT electrodes is further more preferably within a range specified in the rightmost column of Table 6, because the fractional bandwidth can be significantly increased to about 30% or more.

Figure 10:
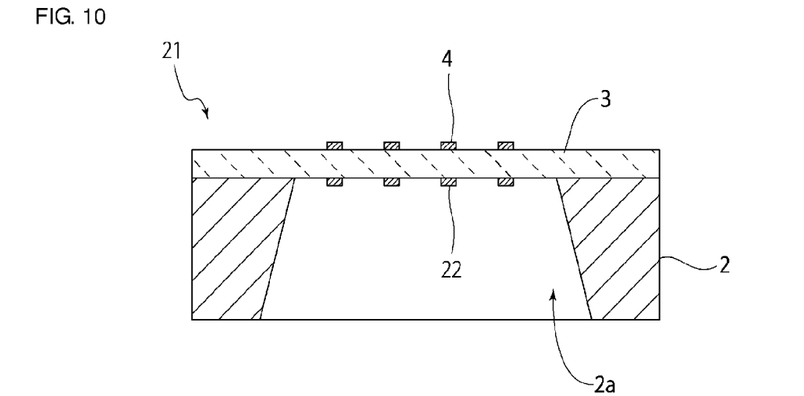
FIG. 10 is a front sectional view of an elastic wave device according to another preferred embodiment of the present invention.

FIG. 10 is a front sectional view of an elastic wave device according to a second preferred embodiment of the present invention. In the elastic wave device 21 of the second preferred embodiment, IDT electrodes 4 are located on the upper surface of a LiNbO$_3$ substrate 3 and IDT electrodes 22 are located on the lower surface thereof. That is, the electrodes are located on both surfaces of the LiNbO$_3$ substrate 3. Incidentally, the electrode structures of both surfaces are preferably the same. Thus, a pair of reflectors, which are not shown, are located on the lower surface.

In a preferred embodiment of the present invention, the IDT electrodes 4 and 22 may be located on both surfaces of the LiNbO$_3$ substrate 3 like the elastic wave device 21.

Figure 11:
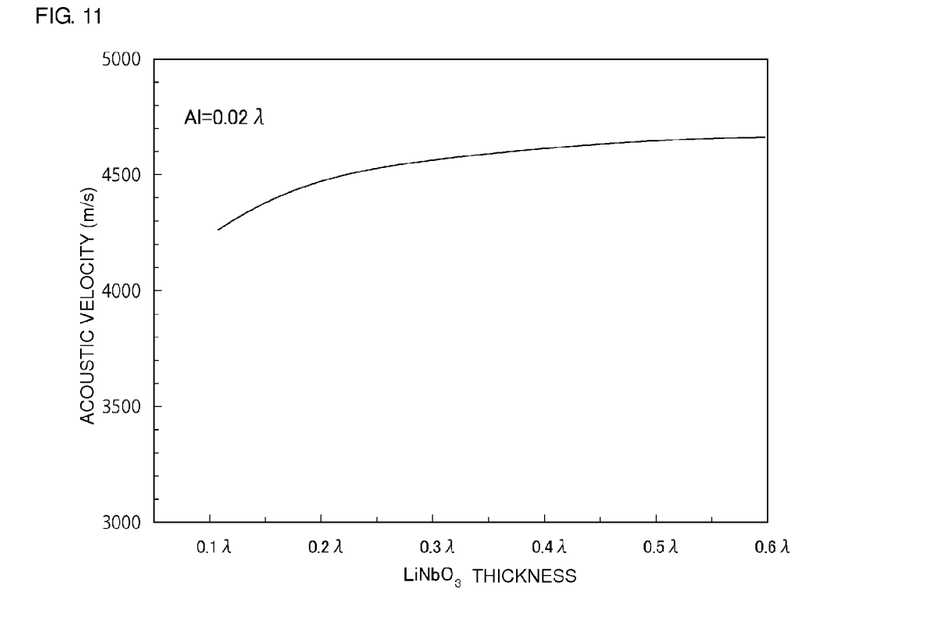
FIG. 11 is a graph showing the relationship between the thickness of LiNbO$_3$ substrates with Euler angles (0°, 118°, 0°) and the acoustic velocity in the case of using IDT electrodes which are made of Al and which have a thickness of about 0.02λ.

FIG. 11 is a graph showing the relationship between the thickness of LiNbO$_3$ and the acoustic velocity of an SH plate wave in the case where IDT electrodes 4 and 22 which have a thickness of about 0.02λ and which are made of Al are located on both surfaces of a LiNbO$_3$ substrate with Euler angles (0°, 118°, 0°).

As is clear from FIG. 11, in a structure in which the IDT electrodes are located on both surfaces, the acoustic velocity of the SH plate wave does not significantly vary even though the thickness of LiNbO$_3$ varies.

Figure 12:
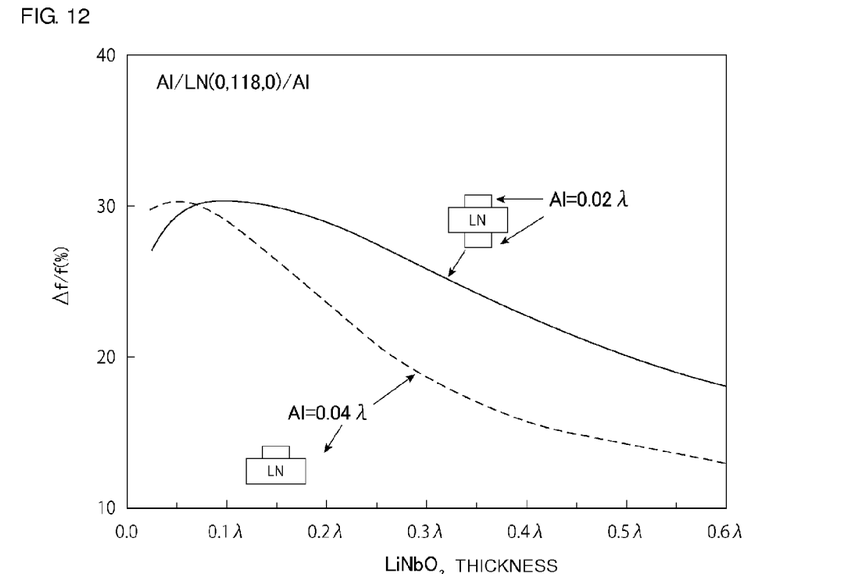
FIG. 12 is a graph showing the relationship between the thickness of LiNbO$_3$ substrates with Euler angles (0°, 118°, 0°) and the fractional bandwidth in the case where IDT electrodes made of Al have a thickness of about 0.04λ and IDT electrodes which are located on both surfaces and which are made of Al have a thickness of about 0.02λ.

A solid line in FIG. 12 represents the relationship between the thickness of LiNbO$_3$ having a structure in which IDT electrodes which have a thickness of about 0.02λ and which are made of Al are located on both surfaces of each of LiNbO$_3$ substrates with Euler angles (0°, 118°, 0°) and the fractional bandwidth. For comparison, a broken line represents the relationship between the fractional bandwidth and the thickness of LiNbO$_3$ substrates having a structure in which IDT electrodes which have a thickness of about 0.04λ and which are made of Al are located on a single surface of each of the LiNbO$_3$ substrates.

As is clear from FIG. 12, in the structure in which the IDT electrodes made of Al are located on both surfaces, the fractional bandwidth is significantly increased over a wide range when the sum of the thicknesses of the IDT electrodes is equal to the sum of the thicknesses of the comparative IDT electrodes. It is clear that when the thickness of the LiNbO$_3$ substrate ranges from about 0.02λ to about 0.27λ, the fractional bandwidth Δf/f can be adjusted to about 27% or more. The thickness of the LiNbO$_3$ substrate more preferably ranges from about 0.02λ to about 0.15λ, because the fractional bandwidth Δf/f can be adjusted to about 30% or more.

Figure 13:
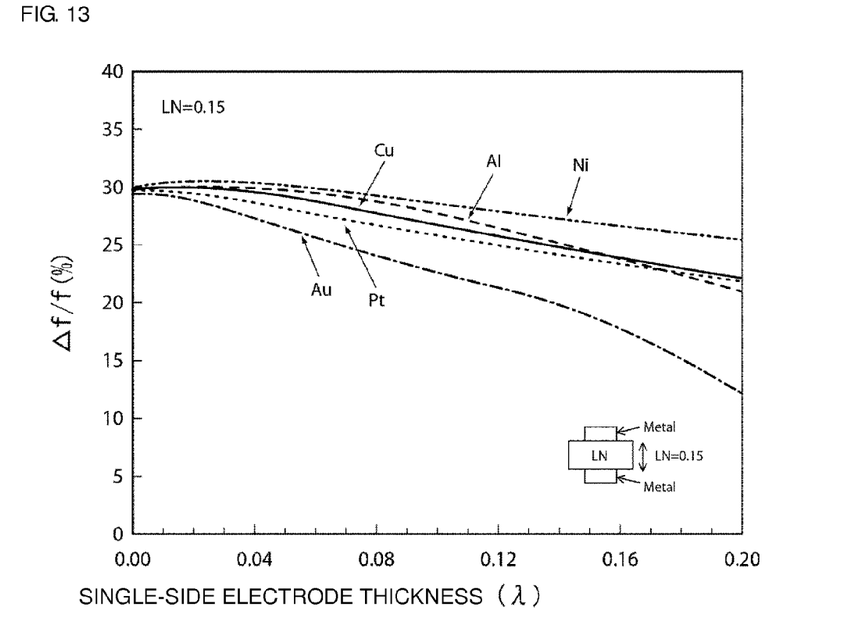
FIG. 13 is a graph showing the relationship between the thickness of single-side IDT electrodes made of various different metals and the fractional bandwidth of a structure in which the IDT electrodes are located on both surfaces of each of LiNbO$_3$ substrates having Euler angles (0°, 118°, 0°) and a thickness of about 0.15λ.

On the other hand, FIG. 13 is a graph showing the relationship between the thickness of single-side IDT electrodes and the fractional bandwidth Δf/f in the case where the thickness of LiNbO$_3$ is about 0.15λ and IDT electrodes made of various different metals are located on both surfaces of each substrate. As is clear from FIG. 13, in a structure in which the IDT electrodes are located on both surfaces, when the thickness of the single-side IDT electrodes ranges from more than 0 to about 0.1λ, a large fractional bandwidth is obtained even though the electrodes are made of various metals.

Figure 14:
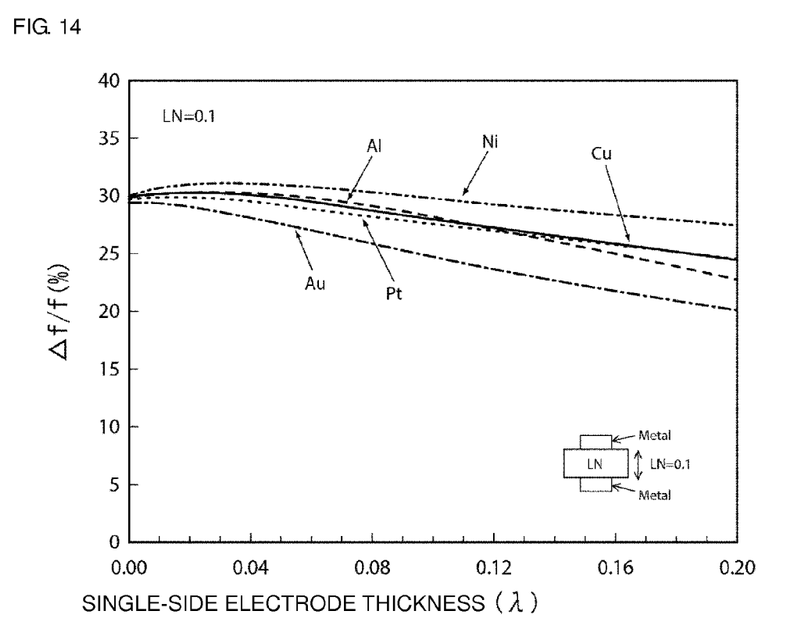
FIG. 14 is a graph showing the relationship between the thickness of single-side IDT electrodes made of various different metals and the fractional bandwidth of a structure in which the IDT electrodes are located on both surfaces of each of LiNbO$_3$ substrates having Euler angles (0°, 118°, 0°) and a thickness of about 0.1λ.

In FIG. 13, the thickness of the LiNbO$_3$ substrate is about 0.15λ. FIG. 14 shows results obtained in the case where the thickness of LiNbO$_3$ is about 0.1λ. As is clear from FIG. 14, when the thickness of single-side IDT electrodes ranges from more than 0 to about 0.1λ, the fractional bandwidth is increased even in the case where the thickness of the LiNbO$_3$ substrate is about 0.1λ and any metal is used.

As is clear from FIG. 14, when IDTs are made of various metals and the thickness of the single-side IDT electrodes is within a range shown in Table 7 below, the fractional bandwidth can be effectively increased.

TABLE 7

| Metal making up electrode | Δf/f: 27% or more Thickness of single-side IDT electrodes | Δf/f: 30% or more Thickness of single-side IDT electrodes |
|---|---|---|
| Pt | More than 0 to 0.14λ or less | — |
| Au | More than 0 to 0.067λ or less | — |
| Cu | More than 0 to 0.145λ or less | More than 0 to 0.045λ or less |
| Ni | 0.002λ to 0.20λ | More than 0 to 0.102λ or less |
| Al | More than 0 to 0.125λ or less | More than 0 to 0.057λ or less |

As is clear from Table 7, when the thickness is within a range specified in the left column of Table 7, the fractional bandwidth can be adjusted to about 27% or more. The thickness is more preferably within a range specified in the right column of Table 7, because the fractional bandwidth can be significantly increased to about 30% or more. Thus, in the elastic wave device 21, in which the IDT electrodes are located on both surfaces, the thickness of the single-side IDT electrodes is preferably within a range specified in Table 7.

Figure 15:
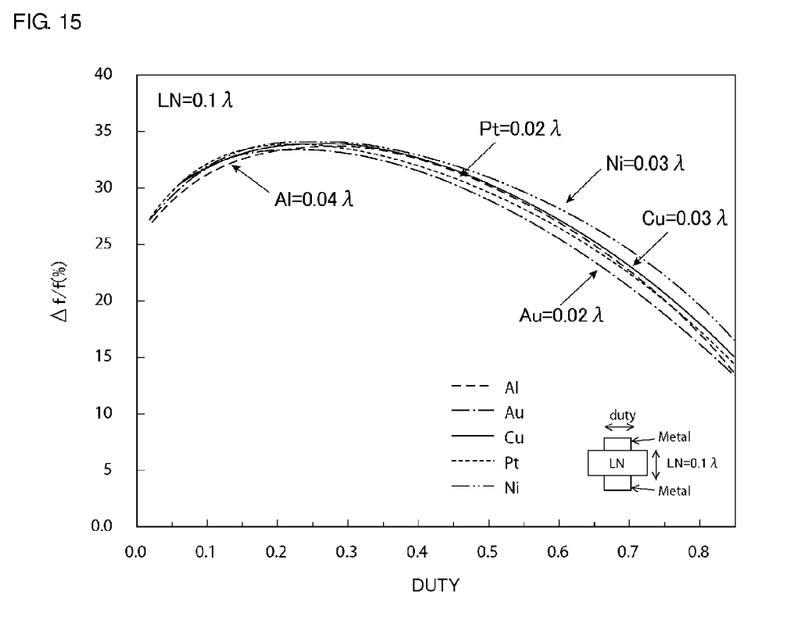
FIG. 15 is a graph showing the relationship between the duty and fractional bandwidth of a structure in which IDT electrodes made of various different metals are located on both surfaces of each of LiNbO$_3$ substrates having Euler angles (0°, 118°, 0°) and a thickness of about 0.1λ.

Next, FIG. 15 shows the relationship between the duty of IDT electrodes and the fractional bandwidth of the elastic wave device 21 in the case where the IDT electrodes are made of various metals and have a thickness of about 0.02λ, about 0.03λ, or about 0.04λ. As is clear from FIG. 15, the fractional bandwidth Δf/f increases with the increase of the duty and the fractional bandwidth Δf/f tends to decrease again as the duty exceeds a range from about 0.2 to about 0.25 even in the case of using any metal. It is clear from FIG. 15 that the fractional bandwidth can be increased in such a way that the duty is adjusted within a range specified in Table 8 below depending on the type of a metal making up the IDT electrodes.

TABLE 8

| Metal making up electrode | Δf/f: 28% or more Duty | Δf/f: 30% or more Duty | Δf/f: 32% or more Duty |
|---|---|---|---|
| Pt | 0.018 to 0.547 | 0.05 to 0.5 | 0.08 to 0.41 |
| Au | 0.018 to 0.523 | 0.05 to 0.47 | 0.10 to 0.38 |
| Ni | 0.018 to 0.597 | 0.05 to 0.55 | 0.10 to 0.46 |
| Cu | 0.018 to 0.567 | 0.05 to 0.52 | 0.10 to 0.43 |
| Al | 0.025 to 0.56 | 0.07 to 0.52 | 0.12 to 0.43 |

As is clear from Table 8, when the duty is within a range specified in the leftmost column of Table 8, the fractional bandwidth can be increased to about 28% or more. The duty is more preferably within a range specified in the second column from the left of Table 8, because the fractional bandwidth can be increased to about 30% or more. The duty is further more preferably within a range specified in the rightmost column of Table 8, because the fractional bandwidth can be increased to about 32% or more.

In first and second preferred embodiments, the support 2 includes the through-hole 2a. A support substrate with an upper surface including a recessed portion facing a region provided with IDT electrodes may be used instead of the support 2.

That is, the following structure can be used: an appropriate structure in which a portion of a LiNbO$_3$ substrate that is provided with IDT electrodes is mechanically freed.

The electrode structure of an elastic wave device is not limited to the one port-type elastic wave resonator shown in FIG. 1B. An appropriate electrode structure can be used depending on a resonator or filter making use of an elastic wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a LiNbO$_3$ substrate;
an IDT electrode located on at least one surface of the LiNbO$_3$ substrate; and
a support arranged on the LiNbO$_3$ substrate such that the support is located outside a region provided with the IDT electrode and supports the LiNbO$_3$ substrate; wherein
an elastic wave propagating in the LiNbO$_3$ substrate is an SH plate wave; and
θ of Euler angles (0°, θ, 0°) of the LiNbO$_3$ substrate ranges from about 92° to about 138° and a thickness of the LiNbO$_3$ substrate ranges from about 0.05λ to about 0.25λ, where λ is a wavelength determined by a pitch between electrode fingers of the IDT electrode.

2. The elastic wave device according to claim 1, wherein the IDT electrode is made of a metal containing one of a plurality of metals shown in Table 1 below as a major component and have a thickness within a range specified in Table 1 depending on a type of the metal:

TABLE 1

|  | Thickness of IDT electrode |
|---|---|
| Pt | More than 0 to $0.083\lambda$ or less |
| Au | More than 0 to $0.055\lambda$ or less |
| Cu | More than 0 to $0.11\lambda$ or less |
| Ni | More than 0 to $0.16\lambda$ or less |
| Al | More than 0 to $0.135\lambda$ or less. |

3. The elastic wave device according to claim 1, wherein the IDT electrode is made of a metal containing one of a plurality of metals shown in Table 2 below as a major component and a duty is within a range specified in Table 2 depending on a type of the metal:

TABLE 2

|  | Duty |
|---|---|
| Pt | 0.105 to 0.62 |
| Au | 0.105 to 0.585 |
| Cu | 0.11 to 0.645 |
| Ni | 0.11 to 0.655 |
| Al | 0.115 to 0.63. |

4. The elastic wave device according to claim 2, wherein the IDT electrode is made of a metal containing one of a plurality of metals shown in Table 2 below as a major component and a duty is within a range specified in Table 2 depending on a type of the metal:

TABLE 2

|  | Duty |
|---|---|
| Pt | 0.105 to 0.62 |
| Au | 0.105 to 0.585 |
| Cu | 0.11 to 0.645 |
| Ni | 0.11 to 0.655 |
| Al | 0.115 to 0.63. |

5. The elastic wave device according to claim 1, wherein the IDT electrode is located on both surfaces of the LiNbO$_3$ substrate, the IDT electrode is made of a metal containing one of a plurality of metals shown in Table 3 below as a major component, and a thickness of the IDT electrode is within a range specified in Table 3 depending on a type of the metal:

TABLE 3

| Metal making up electrode | Thickness of single-side IDT electrodes |
|---|---|
| Pt | More than 0 to $0.14\lambda$ or less |
| Au | More than 0 to $0.067\lambda$ or less |
| Cu | More than 0 to $0.145\lambda$ or less |
| Ni | $0.002\lambda$ to $0.20\lambda$ |
| Al | More than 0 to $0.125\lambda$ or less. |

6. The elastic wave device according to claim 1, wherein the IDT electrode is located on both surfaces of the LiNbO$_3$ substrate and a duty of the IDT electrode is within a range specified in Table 4 below depending on a type of a metal making up the IDT electrode:

TABLE 4

| Metal making up electrode | Duty |
|---|---|
| Pt | 0.018 to 0.547 |
| Au | 0.018 to 0.523 |
| Ni | 0.018 to 0.597 |
| Cu | 0.018 to 0.567 |
| Al | 0.025 to 0.56. |

7. The elastic wave device according to claim 5, wherein the IDT electrode is located on both surfaces of the LiNbO$_3$ substrate and a duty of the IDT electrode is within a range specified in Table 4 below depending on a type of a metal making up the IDT electrode:

TABLE 4

| Metal making up electrode | Duty |
|---|---|
| Pt | 0.018 to 0.547 |
| Au | 0.018 to 0.523 |
| Ni | 0.018 to 0.597 |
| Cu | 0.018 to 0.567 |
| Al | 0.025 to 0.56. |

8. The elastic wave device according to claim 1, wherein the support is a support substrate including a through-hole facing a region provided with the IDT electrode.

9. The elastic wave device according to claim 2, wherein the support is a support substrate including a through-hole facing a region provided with the IDT electrode.

10. The elastic wave device according to claim 3, wherein the support is a support substrate including a through-hole facing a region provided with the IDT electrode.

11. The elastic wave device according to claim 4, wherein the support is a support substrate including a through-hole facing a region provided with the IDT electrode.

12. The elastic wave device according to claim 5, wherein the support is a support substrate including a through-hole facing a region provided with the IDT electrode.

13. The elastic wave device according to claim 6, wherein the support is a support substrate including a through-hole facing a region provided with the IDT electrode.

14. The elastic wave device according to claim 7, wherein the support is a support substrate including a through-hole facing a region provided with the IDT electrode.

15. The elastic wave device according to claim 1, wherein the IDT electrode is made of a metal containing a metal having a density between about $2.699\times10^3$ kg/m$^3$ to about $8.93\times10^3$ kg/m$^3$ as a major component.

16. The elastic wave device according to claim 2, wherein the IDT electrode is made of a metal containing a metal having a density between about $2.699\times10^3$ kg/m$^3$ to about $8.93\times10^3$ kg/m$^3$ as a major component.

17. The elastic wave device according to claim 3, wherein the IDT electrode is made of a metal containing a metal having a density between about $2.699\times10^3$ kg/m$^3$ to about $8.93\times10^3$ kg/m$^3$ as a major component.

18. The elastic wave device according to claim 4, wherein the IDT electrode is made of a metal containing a metal having a density between about $2.699\times10^3$ kg/m$^3$ to about $8.93\times10^3$ kg/m$^3$ as a major component.

19. The elastic wave device according to claim 5, wherein the IDT electrode is made of a metal containing a metal having a density between about $2.699\times10^3$ kg/m$^3$ to about $8.93\times10^3$ kg/m$^3$ as a major component.

20. The elastic wave device according to claim 6, wherein the IDT electrode is made of a metal containing a metal having a density between about $2.699 \times 10^3$ kg/m$^3$ to about $8.93 \times 10^3$ kg/m$^3$ as a major component.

* * * * *